US005669508A

United States Patent [19]
Chen et al.

[11] Patent Number: 5,669,508
[45] Date of Patent: Sep. 23, 1997

[54] POD CARRIER FUNCTION EXPANSION BY ADDING A FIXTURE

[75] Inventors: Chen-Chin Chen, Tou-Feng; Kuei-Lung Chou, Hsin-Chu, both of Taiwan

[73] Assignee: Taiwan Semiconductor Manufacturing Company, Ltd., Hsin-Chu, Taiwan

[21] Appl. No.: 654,518

[22] Filed: May 28, 1996

[51] Int. Cl.⁶ .................................................. B65D 95/48
[52] U.S. Cl. ...................... 206/710; 206/454; 206/232; 220/735
[58] Field of Search ............................ 206/710, 454, 206/455, 712, 723, 701, 232, 459.5; 220/735

[56] References Cited

U.S. PATENT DOCUMENTS 3,926,361 12/1975 Hilderbrand ............................ 206/232
4,183,444 1/1980 English et al. ......................... 220/735
4,674,939 6/1987 Maney et al. .......................... 414/292
4,739,882 4/1988 Parikah et al. ........................ 206/454
5,322,183 6/1994 Strachan .............................. 220/735

*Primary Examiner*—Paul T. Sewell
*Assistant Examiner*—Nhan T. Lam
*Attorney, Agent, or Firm*—George O. Saile

[57] ABSTRACT

A transportable apparatus, or a pod carrier, is disclosed in conjunction with a standardized mechanical interface system (SMIF) whereby the tracking of transported articles is made easier and more reliable. This is accomplished by affixing a card-holder to the pod carrier. The card-holder can hold the process run-cards snugly, or otherwise, at all times in such a way that the cards are visible and amenable to expeditious processing. It is shown that by extending the function of a pod carrier to a tracking device as well, the probability of lost run-cards and the concomitant lost time in the manufacturing line, and/or missteps in the processing of parts are reduced.

30 Claims, 2 Drawing Sheets

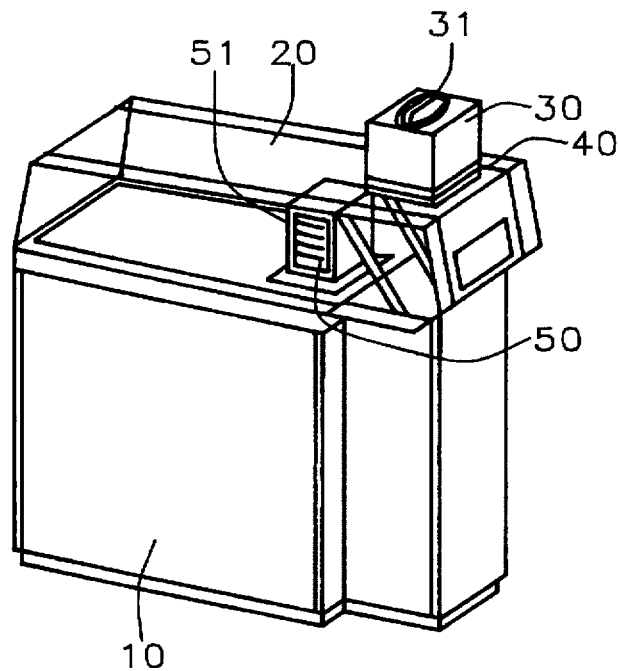
FIG. 1 – Prior Art
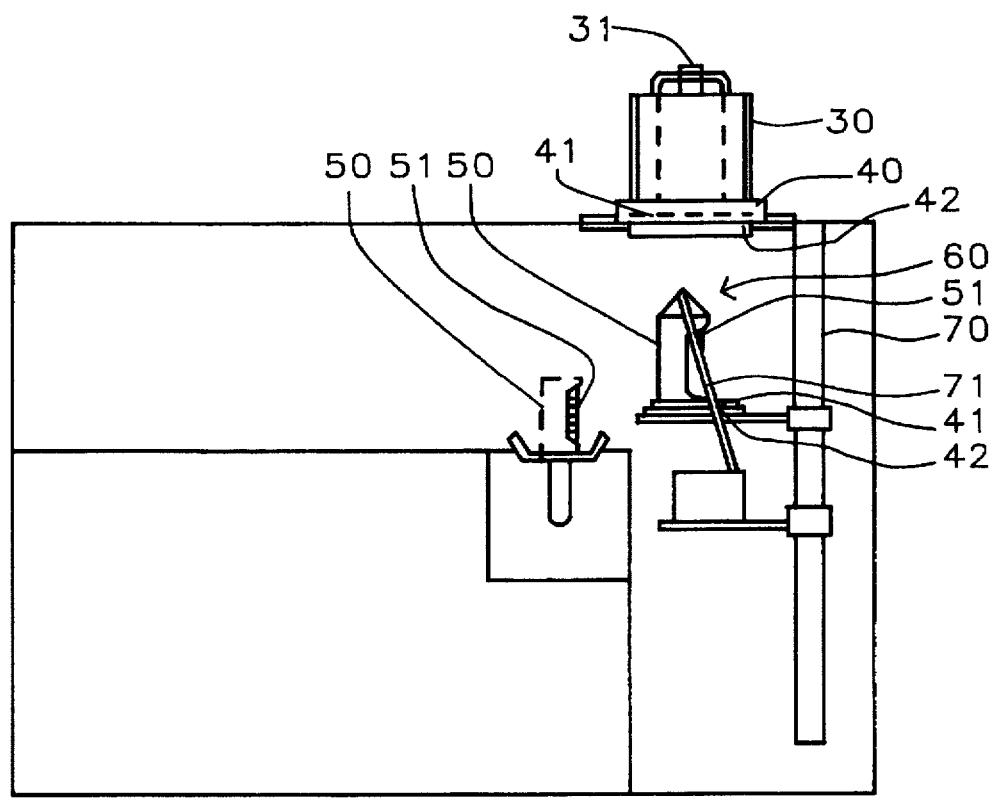
FIG. 2 – Prior Art

POD CARRIER FUNCTION EXPANSION BY ADDING A FIXTURE

BACKGROUND OF THE INVENTION

(1) Field of the Invention

The invention relates generally to standardized mechanical interface systems for reducing particle contamination and more particularly to apparatus employing sealed containers suitable for transporting semiconductor articles in a manufacturing environment.

(2) Description of the Related Art

Standardized mechanical interface systems (SMIF) have been in use for quite a number of years now for the purposes of reducing contamination of semiconductor articles, especially those of wafers, as they are being transported from one station to another for various processing steps in a manufacturing line. In a typical embodiment, the SMIF system itself is usually comprised of three main parts, namely, 1) dustproof boxes for storing and transporting wafer cassettes, 2) a canopy that will accept the wafer cassettes from said boxes and transfer them to the processing equipment, 3) special doors on both the boxes and the canopy that will facilitate the transfer of wafers without exposing the wafers to ambient environment outside the boxes and the canopy. One such embodiment is described in U.S. Pat. No. 4,674,939. In another embodiment described in U.S. Pat. No. 4,739,882, the box container has a disposable liner to further reduce the contamination levels of the wafer as they are being transported between processing equipments.

In all these schemes using the SMIF systems, the main objective is to keep the main sources of contamination, namely, personnel, equipment, and chemicals, away from semiconductor articles. People are the most offenders when it comes to shedding skin flakes, which are easily ionized and cause defects. Although clean room garments reduce particle emissions, they do not stop them from eliminating completely. Defect causing particles are also generated by the processing equipment themselves and the chemicals used in the equipment. To minimize defects, therefore, electronic articles in general, and wafers in particular, must be isolated from contaminant particles. For this purpose, special boxes are built based on a particular concept, the SMIF.

The SMIF is based on the concept that if the component that is to be protected from the contaminants is actually held in an environment of its own—which is free of contaminants in the first place, that is, in the smallest volume possible of still, particle-free air, with no internal source of particles— then, that environment is the cleanest environment that is attainable. The boxes that hold the wafers, therefore, are built with this principle in mind, and they perform well. For example, air in a box can be held as low as in a "class 10" environment, meaning that the environment has a maximum of 10 particles per cubic foot, or 350 particles per cubic meter.

In building the said boxes, however, most of the attention is directed towards what's inside the box; namely, wafers, contaminants, and so forth, and rightly so. However, it will be appreciated by those skilled in the workings of the manufacturing floor that it is equally, if not more, important that the dustproof boxes arrive at their proper destination stations, and that the contents of the boxes are subjected to the treatments for which they were intended. It has been observed in the present state of the manufacturing line that valuable time is lost in locating the special routing cards that must accompany each box to their destinations. An even more disconcerting observation is that boxes without proper cards are sometimes subjected to mis-operations simply because the appropriate run-card is missing, that is the card that tells the operator what process is to be performed, is simply missing.

The reason for mishaps such as described above being so common in today's manufacturing lines is that the boxes, or "pod carriers", as they are often referred to, are not designed to have the means by which the run-cards can be readily and easily attached to the traveling boxes or pod carriers. More often than not, the haphazardly attached cards—may it be by simply folding the run-card and sticking it under the handle of the pod carrier, or by means of plastic straps which are threaded through a hole in the card and then wrapped on to the handle—get lost because they are not secured to the box properly. The end result then is long process delay times while the appropriate run-card is located, or major defects in the product caused by not what was meant to be avoided, namely, the contaminants, but by inadequate box or pod carrier design to carry along the run-card properly.

It is, therefore, evident that there is a need for an improved box or pod carrier design, which it too can be standardized as a part of the SMIF and enable the system run smoothly without any lost cards and without the concomitant problems of defective parts in the semiconductor manufacturing line.

SUMMARY OF THE INVENTION

It is therefore an object of this invention to provide an improved method for tracking containers or boxes which carry semiconductor articles from one process equipment to another in a manufacturing line.

It is a further object of the invention to provide a method for eliminating defects caused by poor procedural steps.

These objects are achieved by providing a standardized mechanical interface (SMIF) system in which the wafer carrying box is fitted with a special flexible compartment designed to carry easily and securely the process instructions, or a run-card. The ease with which the run-cards are attached to the box is provided by an upside-down U-shaped and curved flexible plastic, such as Lexan, straddling and at the same time hugging the two sides of the box. Two screws on top of the box hold the plastic piece in place. The run-card is then pushed into either one of the curved slots on the two sides of the box formed by the plastic piece and the sides of the box. In another embodiment, the plastic is made to form a straight and rectangular slot to accept the run-card.

BRIEF DESCRIPTION OF THE DRAWINGS

FIG. 1 is a perspective view of a prior art standard mechanical interface (SMIF) system adapted to a processing equipment.

FIG. 2 is a schematic representation of prior art mechanisms used in SMIF system of FIG. 1.

DESCRIPTION OF THE PREFERRED EMBODIMENTS

Figure 3:
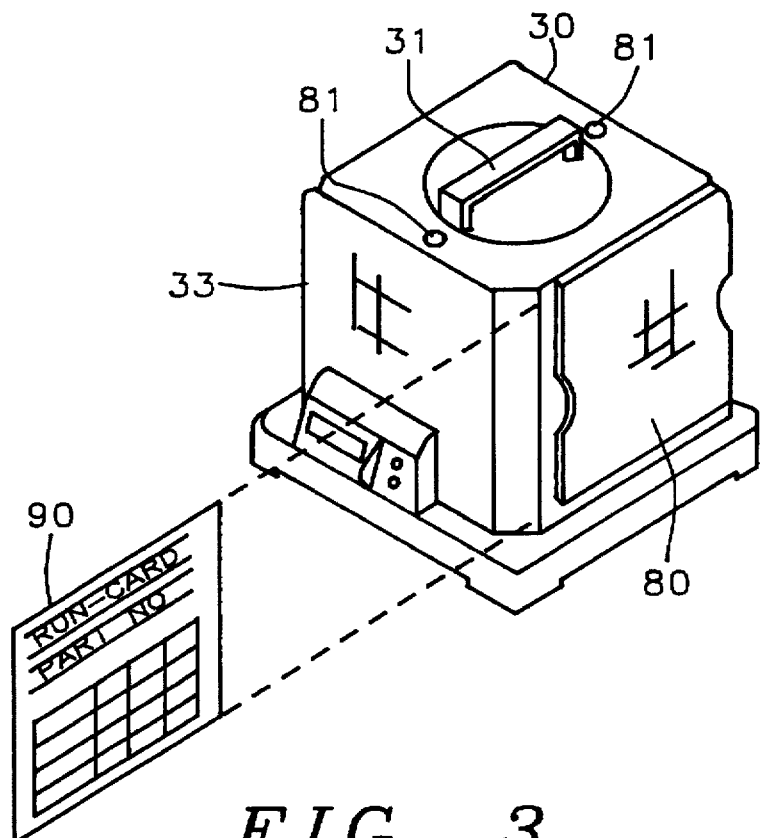
FIG. 3 is a perspective view of the transportable container, or pod carrier, fitted with a card-holder of this invention.
Figures 4A, 4B:
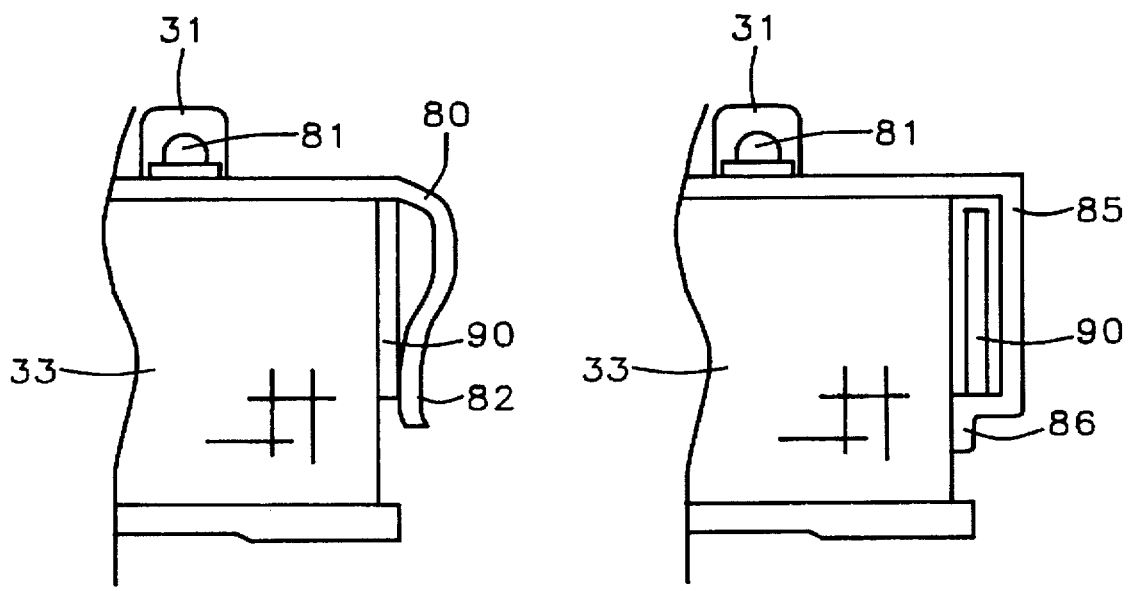
FIG. 4a is a partial cross-section of the pod carrier of FIG. 3 and of the curved slot type card-holder of this invention.
FIG. 4b is a partial cross-section of the pod carrier of FIG. 3 and of the straight slot type card-holder of this invention.

Referring now to the drawings, more particularly to FIGS. 3 and 4a, 4b, there is illustrated a container apparatus with a novel card-holder for the purpose of improving the handling of semiconductor articles in a manufacturing line.

In FIG. 1, a process equipment (10) is shown along with a standardized mechanical interface (SMIF) system comprised of a canopy (20), a transportable container, box, or pod carrier (30), and a port complex (40) designed to facilitate the transfer of the contents of the pod carrier into the space under the canopy without exposing the contents to the ambient surroundings. The pod is carried by its handle (31). Canopy (20) is an easily removable shield that covers the wafer-handling mechanism (60) of the processing equipment (10) shown in FIG. 2. Item (10) in both FIGS. 1 and 2 represents any processing equipment such as a mask aligner, photoresist applicator, or an inspection station. Canopy (20) is made out of transparent plastic such as Lexan to facilitate inspection/maintenance within the canopy. In addition to the handling mechanism of the processing equipment mentioned above, canopy (20) encloses also a wafer cassette (50) which holds wafers (51), all in a clean room environment so that equipment (10) need not be installed in a clean room. These features of SMIF systems are well known in the art and as they are not significant to the invention, they are not described in detail here in order not to unnecessarily obscure the present invention. It will be sufficient to note that after the pod carrier (30) is placed over the port (40) on canopy (20), a latching mechanism opens the doors (41) and (42) of the pod carrier and that of the canopy, respectively, so that any contaminant particulates on the doors are trapped together within the confines of the door surfaces. The door complex so formed, and the wafer cassette above them are lowered into the processing equipment by means of an elevator mechanism (70) that is shown in FIG. 2. An arm (71) then moves the cassette (50) only into a position from which the processing of the wafers may begin.

To facilitate the transport of wafers from one processing equipment to another in an orderly and smooth fashion, the pod carrier in which the wafers reside is equipped with a card-holder (80) as shown in FIG. 3. Pod carrier (30) has a removable door (33) on a front side. The disclosed card-holder (80) is an added fixture to the existing pod carrier (30), thereby extending the function of the pod carrier for improved tracking of the pod. The card-holder (80) shown in FIG. 4a is curved on two sides of the pod carrier such that when it is assembled on the pod by pushing it downwards until it is seated on the pod carrier, the lower portion (82) of the curved section fits snugly around the pod carrier. The card-holder is then simply secured to the pod carrier by means of the two screws (81) shown in FIG. 4a. It will be appreciated that the card-holder is made out of a material that is flexible to accept a run-card when the edge of the latter is gently pushed forward and downwards from the upper space of the looped section to the lower section that will hold the card snugly against the side of the pod carrier. Preferably, the card-holder is made out of a clear plastic, such as Lexan, so that the tracking information on the run-card is readily visible through the card-holder. It is also preferred that the thickness of the plastic is between about 1.8 mm and 2.0 mm.

In another embodiment, the card-holder is shaped in the form of a straight slot (85) rather than as a curved slot (80) described above. In this preferred mode shown in FIG. 4b, the card-holder is made to fit snugly against the sides of the pod-carrier with a square end (86), while the assembly is again secured by means of the two screws (81). The card-holder (85) has one or two straight slots on either or both sides of the pod-carrier (30). In sill another embodiment, one end of the straight slot (85) is closed to prevent the run-card from sliding out of the slot when the pod-carrier is tilted during transport.

While the invention has been particularly shown and described with reference to the preferred embodiments thereof, it will be understood by those skilled in the art that various changes in form and details may be made without departing from the spirit and scope of the invention.

What is claimed is:

1. An apparatus for carrying articles to be processed in a substantially clean environment free of contaminant particles comprising:

a box for storing said articles;

said box having a clean environment inside; said box having a handle on top;

said box having a door on frontal side; said box having a card-holder on a side adjacent to said frontal side; and said card-holder comprising a U-shaped attachment with the legs hugging the sides of the box and with each leg forming a curved slot having a looped section.

2. The apparatus of claim 1, wherein said storing is accomplished by means of a cassette.

3. The apparatus of claim 1, wherein said articles are wafers.

4. The apparatus of claim 1, wherein said clean environment is of class 10 comprising less than 10 dust particles per cubic foot.

5. The apparatus of claim 1, wherein said handle is foldable.

6. The apparatus of claim 1, said handle is removable.

7. The apparatus of claim 1, wherein said door is removable.

8. The apparatus of claim 1, wherein said curved slot having a looped section is open at one end.

9. The apparatus of claim 8, wherein said curved slot having a looped section is formed straddlingly and snugly pressing onto to the sides of said box.

10. The apparatus of claim 1, wherein said card-holder is screwed to the top of said box.

11. The apparatus of claim 10, wherein said screws are two or more in number.

12. The apparatus of claim 1, wherein said card-holder is made out of clear plastic.

13. The apparatus of claim 12, wherein the thickness of said plastic is between about 1.8 mm to 2.0 mm.

14. The apparatus of claim 1, wherein said box is a sealed pod used for transporting semiconductor articles in a manufacturing line.

15. The apparatus of claim 1, wherein said curved slot having a looped section is open at both ends.

16. An apparatus for carrying articles to be processed in a substantially clean environment free of contaminant particles comprising:

box for storing said articles;

said box having a clean environment inside;

aid box having a handle on top;

said box having a door on frontal side;

said box having a card-holder on a side adjacent to said frontal side; and said card-holder comprising a U-shaped attachment with the legs hugging the sides of the box and with each leg forming a straight slot.

17. The apparatus of claim 16, wherein said storing is accomplished by means of a cassette.

18. The apparatus of claim 16, wherein said articles are wafers.

19. The apparatus of claim 16, wherein said clean environment is of class 10 comprising less than 10 dust particles per cubic foot.

20. The apparatus of claim 16, wherein said handle is foldable.

21. The apparatus of claim 20, said handle is removable.

22. The apparatus of claim 16, wherein said door is removable.

23. The apparatus of claim 16, wherein said straight slot is open at one end.

24. The apparatus of claim 21, wherein said straight slot is formed straddingly and snugly pressing onto to the sides of said box.

25. The apparatus of claim 16, wherein said card-holder is screwed to the top of said box.

26. The apparatus of claim 25, wherein said screws are two or more in number.

27. The apparatus of claim 16, wherein said card-holder is made out of clear plastic.

28. The apparatus of claim 27, wherein the thickness of said plastic is between about 1.8 mm to 2.0 mm.

29. The apparatus of claim 16 wherein said box is a sealed pod used for transporting semiconductor articles in a manufacturing line.

30. The apparatus of claim 16, wherein said straight slot is open at both ends.

* * * * *